(12) United States Patent
Mandyam

(10) Patent No.: US 6,831,954 B1
(45) Date of Patent: Dec. 14, 2004

(54) APPARATUS, AND ASSOCIATED METHOD, FOR COMPENSATING FOR DISTORTION INTRODUCED UPON A SEND SIGNAL BY AN AMPLIFIER

(75) Inventor: Giridhar D. Mandyam, Dallas, TX (US)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/496,120

(22) Filed: Feb. 1, 2000

(51) Int. Cl.⁷ .............................................. H04L 25/34
(52) U.S. Cl. ........................ 375/286; 375/285; 375/346
(58) Field of Search .................................. 375/296, 284, 375/285, 278, 346, 327, 215, 373, 376, 295, 297, 308; 455/126, 295, 63; 330/149

(56) References Cited

U.S. PATENT DOCUMENTS

| | | | | |
|---|---|---|---|---|
| 5,448,203 A | * | 9/1995 | Matui et al. ................. | 330/149 |
| 5,483,681 A | * | 1/1996 | Bergsten et al. ............. | 455/126 |
| 5,497,400 A | * | 3/1996 | Carson et al. ............... | 375/324 |
| 5,531,117 A | * | 7/1996 | Fortes .......................... | 73/602 |
| 5,742,201 A | * | 4/1998 | Eisenberg et al. ............. | 330/2 |
| 5,770,971 A | * | 6/1998 | McNicol ....................... | 330/52 |
| 5,870,668 A | * | 2/1999 | Takano et al. ............... | 455/126 |
| 5,892,397 A | * | 4/1999 | Belcher et al. ............... | 330/149 |
| 6,075,411 A | * | 6/2000 | Briffa et al. ................. | 330/149 |
| 6,246,286 B1 | * | 6/2001 | Persson ....................... | 375/296 |
| 6,275,685 B1 | * | 8/2001 | Wessel et al. ............... | 455/126 |
| 6,396,345 B2 | * | 5/2002 | Dolman ....................... | 330/149 |

\* cited by examiner

*Primary Examiner*—Emmanuel Bayard

(57) ABSTRACT

Apparatus, and an associated method, by which to predistort a send signal prior to its application to a power amplifier. Predistortion compensates for distortion introduced upon the signal during its amplification by the power amplifier. Compensation is effectuated by altering a phase component of symbols of which the signal is formed without affecting the magnitude components thereof.

11 Claims, 5 Drawing Sheets

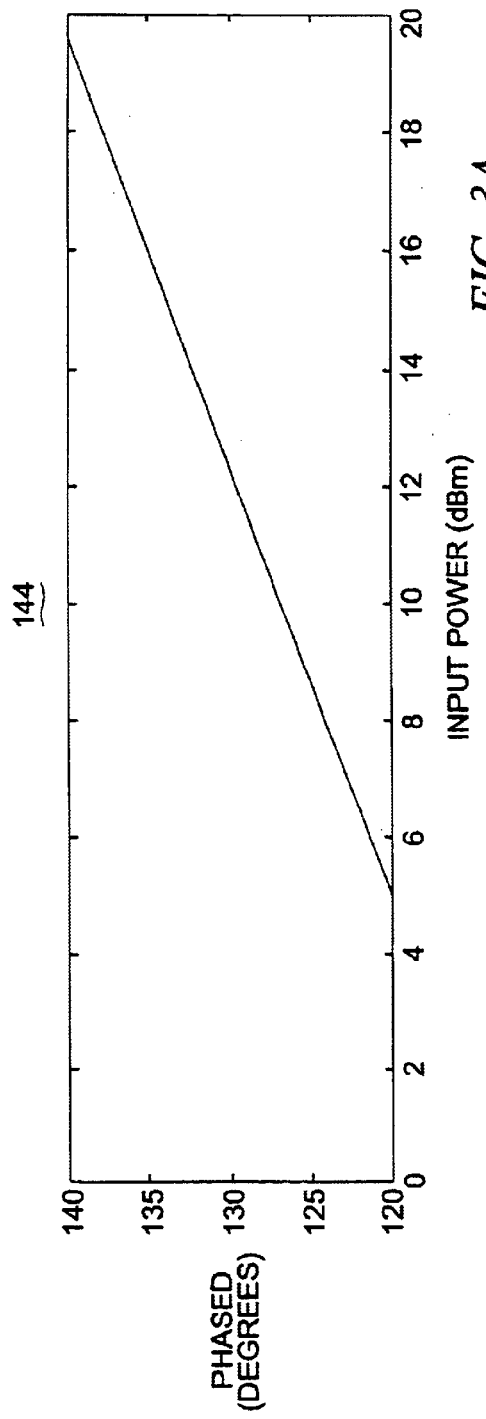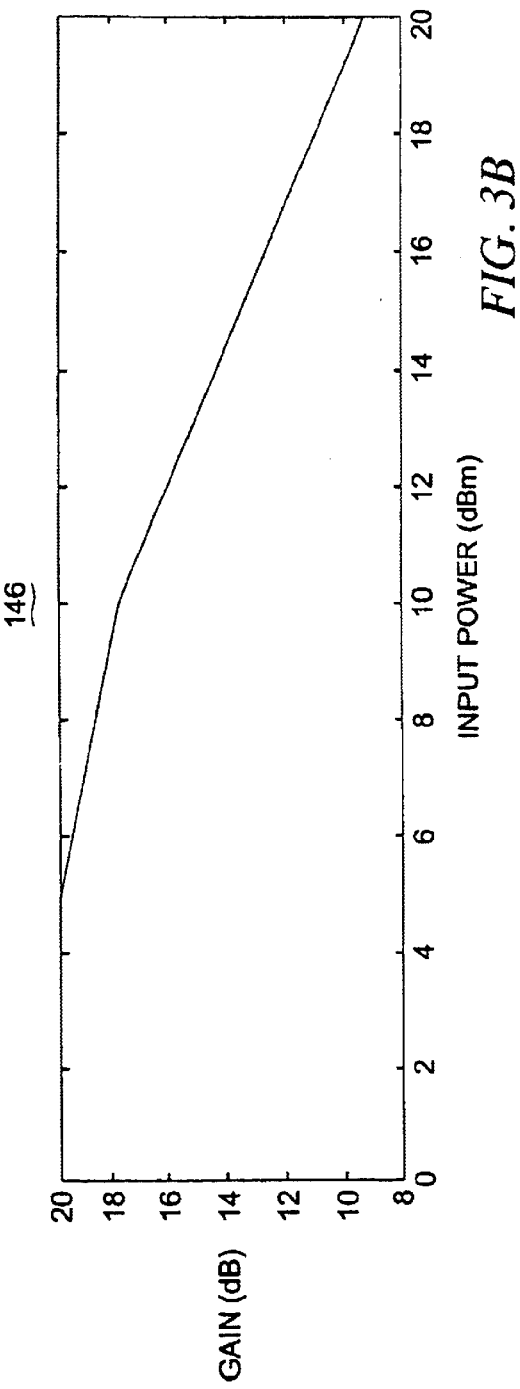

APPARATUS, AND ASSOCIATED METHOD, FOR COMPENSATING FOR DISTORTION INTRODUCED UPON A SEND SIGNAL BY AN AMPLIFIER

The present invention relates generally to a manner by which to compensate for signal distortion introduced upon a send signal during amplification by an amplifier which forms a portion of a sending station. More particularly, the present relates to apparatus, and an associated method, by which to predistort, in a dynamic manner, the send signal to compensate for the distortion introduced upon the send signal. Compensation is effectuated by altering the phase of the send signal by a selected amount without altering the magnitude of the send signal. Operation of an embodiment of the present invention is particularly beneficial when output power magnitude modification is not generally permitted, such as in a CDMA (code-division, multiple-access) communication system.

BACKGROUND OF THE INVENTION

A communication system permits the communication of information between a sending station and a receiving station by way of a communication channel. The sending station is operable to generate a communication signal of characteristics permitting its communication upon the communication channel. And, the receiving station is operable to recover the informational content of the communication signal.

A radio communication system is a communication system in which the communication channel upon which the communication signal is communicated is formed of a radio channel. The radio channel is defined upon a portion of the electromagnetic spectrum. Because a wireline connection is not required to form the communication channel between the sending and receiving stations, communications are possible when such a wireline connection between the sending and receiving stations would be impractical. Improved communication mobility is also possible through use of a radio communication system.

A sending station forming a portion of a radio communication system includes a transmitter for modulating information upon a carrier wave of a carrier frequency within the range of frequencies which defines, at least in part, the communication channel. Through such a process, a baseband signal of which the information is formed is converted into a radio frequency signal of desired frequency characteristics.

The transmitter typically includes one or more up-mixing stages at which the baseband information is up-converted in frequency to be of the selected radio frequency. The mixing stages include a mixer circuit coupled to receive the information and an up-mixing signal with which the information is to be multiplied, or otherwise combined, to form an up-converted signal. When multiple mixing stages are utilized, an if (intermediate frequency) signal is formed at a first, or first series of, mixer stages. A radio frequency signal is formed at the final mixing stage. The radio frequency signal is amplified by a power amplifier to increase the energy level of the signal. Once amplified, the signal is applied to an antenna transducer which converts the radio frequency signal into electromagnetic form for communication upon the communication channel.

A cellular communication system is exemplary of a radio communication system. Cellular communication systems, constructed according to various cellular communication standards, have been installed throughout significant portions of the world. A subscriber to a cellular communication system is able to communicate therein by way of a mobile terminal when the mobile terminal is positioned within an area encompassed by the communication system. Telephonic communication of both voice and non-voice information is permitted by way of such communication systems. The mobile terminal is formed of transceiver circuit and includes both a transmitter portion and a receiver portion.

The transmitter portion of the mobile terminal, as noted above, typically includes a power amplifier at which a send signal is amplified. Power amplifiers, however, are typically of a limited dynamic range. And, within the range of frequencies over which the amplifier is operable, the gain and phase properties of the power amplifier are typically not constant. Such variations result in signal distortion of a signal amplified by such a power amplifier and reduce the communication quality of the resultant communications.

To attempt to compensate for such distortion, various manners of signal precompensation of a signal, prior to its application to the power amplifier, have been developed. Such existing manners generally alter the magnitude levels of the signal prior to its application to the power amplifier. But, such manners by which to precompensate the signal prior to its application to the power amplifier are unavailable, typically, in a CDMA communication system. In a CDMA communication system, maintaining the output power independent of the amplifier characteristic is important for the reason that a fast feedback, power-control mechanism is the manner by which near-far interference from individual users is combatted.

Also, some existing manners by which to perform pre-compensation utilize a look-up table. Generally, however, use of look-up tables are cumbersome and inadequate when dynamic changes are required to be made to effectively compensate for signal distortion caused by amplification of the signal at the power amplifier.

If a manner could be provided by which better to compensate for signal distortion caused by amplification of the signal at a power amplifier, improved communication quality would result.

It is in light of this background information related to generation of a send signal at a sending station that the significant improvements of the present invention have evolved.

SUMMARY OF THE INVENTION

The present invention, accordingly, advantageously provides apparatus, and an associated method, by which to compensate for signal distortion introduced upon a send signal during amplification of the signal by an amplifier which forms a portion of a sending station.

During operation of an embodiment of the present invention, the send signal is predistorted to compensate for the distortion introduced upon the send signal by the amplifier. Predistortion is effectuated by altering the phase of the send signal by a selected amount without altering the magnitude of the send signal. Thereby, distortion of a resultant, amplified signal is reduced without altering the magnitude of the amplified signal.

In one implementation, apparatus is provided for transmitter circuitry of a radio transmitter operable in a radio communication system. A distortion estimator is connected in a feedback relationship with a power amplifier which forms a portion of the radio transmitter circuitry. The distortion estimator is also coupled to receive indications of the send signal prior to its application to the power amplifier. The distortion estimator is operable to compare the send signal, prior to its application to the power amplifier, together with the corresponding send signal, subsequent to amplification by the power amplifier. A distortion estimate is determined therefrom. Parameters which characterize an AM (amplitude modulation)-to-PM (phase modulation) response of the power amplifier are also determined. The parameters include, for instance, the instantaneous power of the send signal. Values determined by the distortion estimator are provided to a phase rotator. The phase rotator is positioned in-line with the power amplifier and is coupled to receive the send signal, prior to its application to the power amplifier. The phase rotator is operable to alter the phase of the send signal responsive to values provided by the distortion estimator.

In one implementation, the radio transmitter circuitry forms a portion of a radio transceiver operable in a cellular communication system which utilizes a QPSK (Quadrature Phase Shift Keying) modulation scheme. In a QPSK modulation scheme, symbols of a QPSK constellation set define the informational content of the send signal generated by the radio transceiver circuitry. Each symbol includes a phase component and a magnitude component. Successive ones of the symbols of which the send signal is formed are applied to the phase rotator, and the phase components of the successive ones of the symbols are rotated to compensate for the distortion of the values of the symbols when amplified at the power amplifier. Because the phase rotator is operable responsive to values provided thereto by the distortion estimator, connected in a feedback relationship with the power amplifier, the predistortion of the signals is effectuated dynamically responsive to determinations of the levels of distortion introduced upon the symbols of the send signal during amplification thereof by the power amplifier.

In one implementation, the radio transceiver is operable in a CDMA (code-division, multiple-access) cellular communication system. Because compensation of the distortion introduced upon the symbols of the send signal is effectuated by altering the phase components of the QPSK symbols, the distortion is compensated for without altering the magnitude components of the symbols. Thereby, system requirements, generally set forth in CDMA cellular communication systems to maintain output power independent of the power amplifier characteristic is assured.

In one implementation, the phase rotator is operable to select a level of phase rotation responsive to parameters calculated at the distortion estimator pertaining to the parameters of an equation which characterizes the AM-to-PM response of the amplifier. The response is constant below a threshold input power level. And, beyond the threshold input power level, the response is linear in a log-domain. Thereby, the phase distortion for which compensation is made is constant when the input power level is beneath the threshold level. And, the phase distortion for which compensation is made is linear when the input power level is beyond the threshold. Compensation of the phase distortion is made by de-rotating the symbol by an amount to compensate for such phase distortion.

In these and other aspects, therefore, apparatus, and an associated method, is provided for a sending station operable to transmit a send signal, once amplified by an amplifier. Compensation is made for distortion introduced upon the send signal when the send signal is amplified by the amplifier. A phase rotator is coupled to receive indications of the send signal prior to amplification by the amplifier. The phase rotator selectably rotates a phase component of the send signal. A distortion estimator is coupled to receive the indications of the send signal prior to amplification by the amplifier and to receive indications of the send signal subsequent to amplification by the amplifier. The distortion estimator estimates an indicia of distortion of the send signal due to amplification thereof by the amplifier. The distortion estimator also provides a distortion estimate signal to the phase rotator, values of the distortion estimate signal determinative of rotation by the phase rotator of the phase component of the send signal.

A more complete appreciation of the present invention and the scope thereof can be obtained from the accompanying drawings, which are briefly summarized below, the following detailed description of the presently-preferred embodiments of the present invention, and the appended claims.

BRIEF DESCRIPTION OF THE DRAWINGS

FIGS. 3A and 3B illustrate graphical representations of the phase and gain response, respectively, of an exemplary power amplifier plotted as functions of input power.

DETAILED DESCRIPTION OF THE PREFERRED EMBODIMENT

Figure 1:
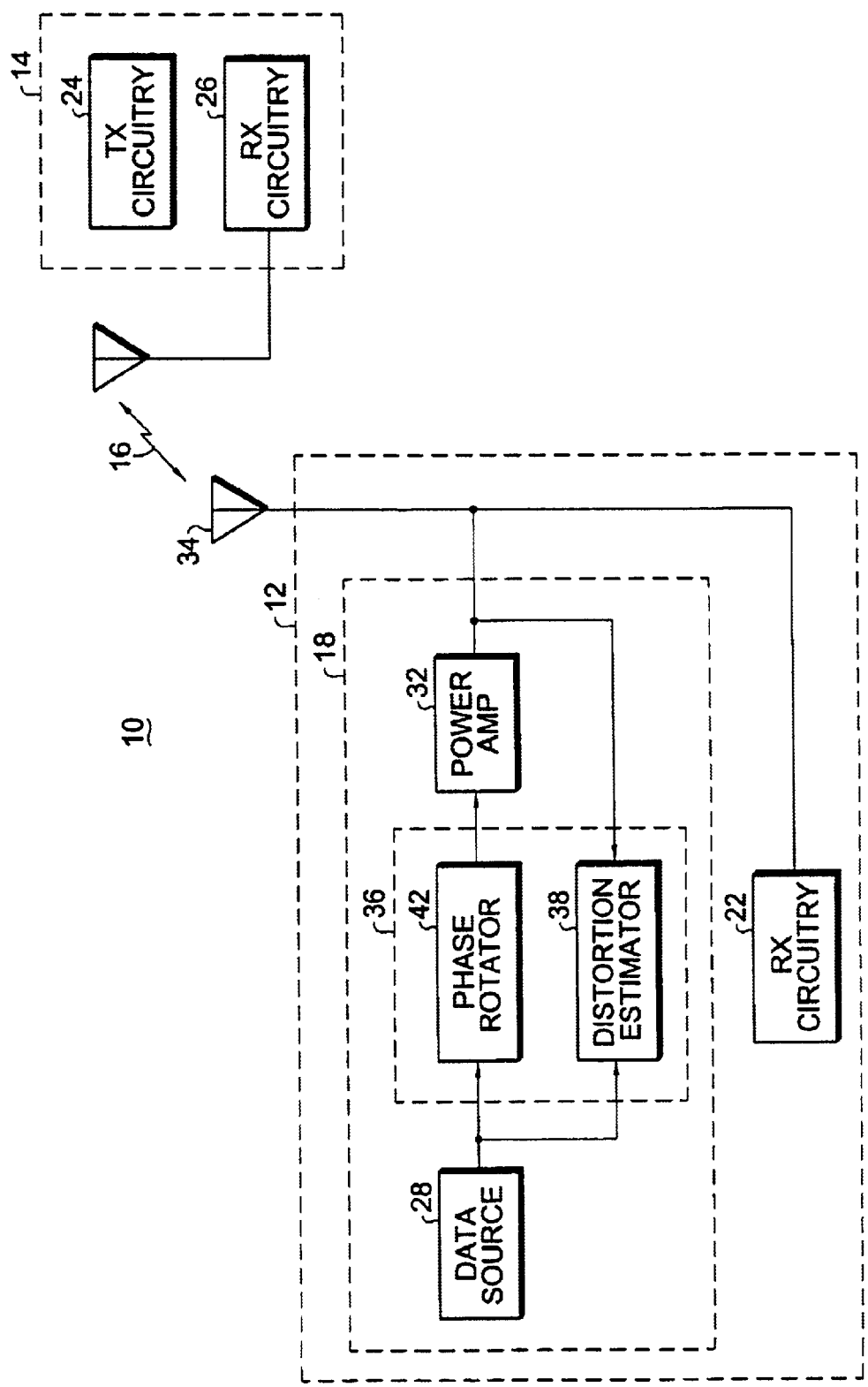
FIG. 1 illustrates a functional block diagram of a communication system in which an embodiment of the present invention is operable.

Referring first to FIG. 1, a communication system, shown generally at 10, is operable to provide for communications between two or more communication stations. While the following description shall be described with respect to an exemplary implementation in which the communication system 10 forms a cellular communication system operable pursuant to a CDMA (code-division, multiple-access) scheme, it should be understood that such description is by way of example only. Operation of an embodiment of the present invention is similarly operable in other types of communication systems, both non-wireline and wireline in nature. Accordingly, operation of an embodiment of the present invention can analogously be described with respect to such other types of communication systems.

The communication system 10 is here shown to include a first communication station 12 and a second communication station 14 coupled by way of a communication channel 16. The first communication station 12 is here representative of a mobile station operable in the cellular communication system, and the second communication station 14 is representative of the radio transceiver portion of the base station system (BSS) of the network infrastructure of the CDMA cellular communication system. In the exemplary implementation, therefore, the first communication station includes both a transmitter circuitry portion 18 and a receiver circuitry portion 22. Analogously, the second communication station 14 also includes a transmitter circuitry portion 24 and a receiver circuitry portion 26.

The transmitter circuitry portion 18 of the first communication station includes a data source 28 at which data to be communicated to the second communication station is generated. The data generated at the data source 28 is modulated and up-converted in frequency and amplified by a power amplifier 32. Once amplified, an amplified signal is transduced by an antenna transducer 34 to permit its communication upon the channel 16 to the second communication station. The apparatus 36 of an embodiment of the present invention is positioned in-line between the data source 28 and the power amplifier 32. The apparatus 36 includes a distortion estimator 38 positioned in a feedback connection between the power amplifier output and an input to a phase rotator 42. The apparatus 36 is operable to compensate for distortion introduced upon a signal when amplified by the power amplifier 32. By compensating for distortion of a signal introduced during its amplification at the power amplifier by "pre-distorting" the signal at the apparatus 36, improved quality of communications between the first and second communication station is possible. In the exemplary implementation, the transmitter circuitry 24 of the second communication station 14 also includes structure analogous to that shown to form portions of the transmitter circuitry 18.

In the exemplary implementation in which the communication system 10 forms a CDMA cellular communication system, the data generated by the data source 28 is converted to form QPSK (Quadrature Phase Shift Keying) symbols selected from a QPSK constellation set. Successive symbols form a send signal which is to be sent by the first communication station. The successive ones of the symbols are applied to the phase rotator 42 whereat, during operation of an embodiment of the present invention, phase components of the symbols are selectably rotated, and thereafter applied to the power amplifier 32 to be amplified thereat. The distortion estimator 38 is operable to determine the amount of distortion introduced upon the symbols during their amplification by the amplifier 32 and to cause the phase rotator to de-rotate the symbols applied to the phase rotator by an amount selected to compensate for the distortion. Compensation is effectuated dynamically by positioning the distortion estimator in the feedback arrangement, thereby to permit speedy and adjustable compensation for the distortion.

Figure 2:
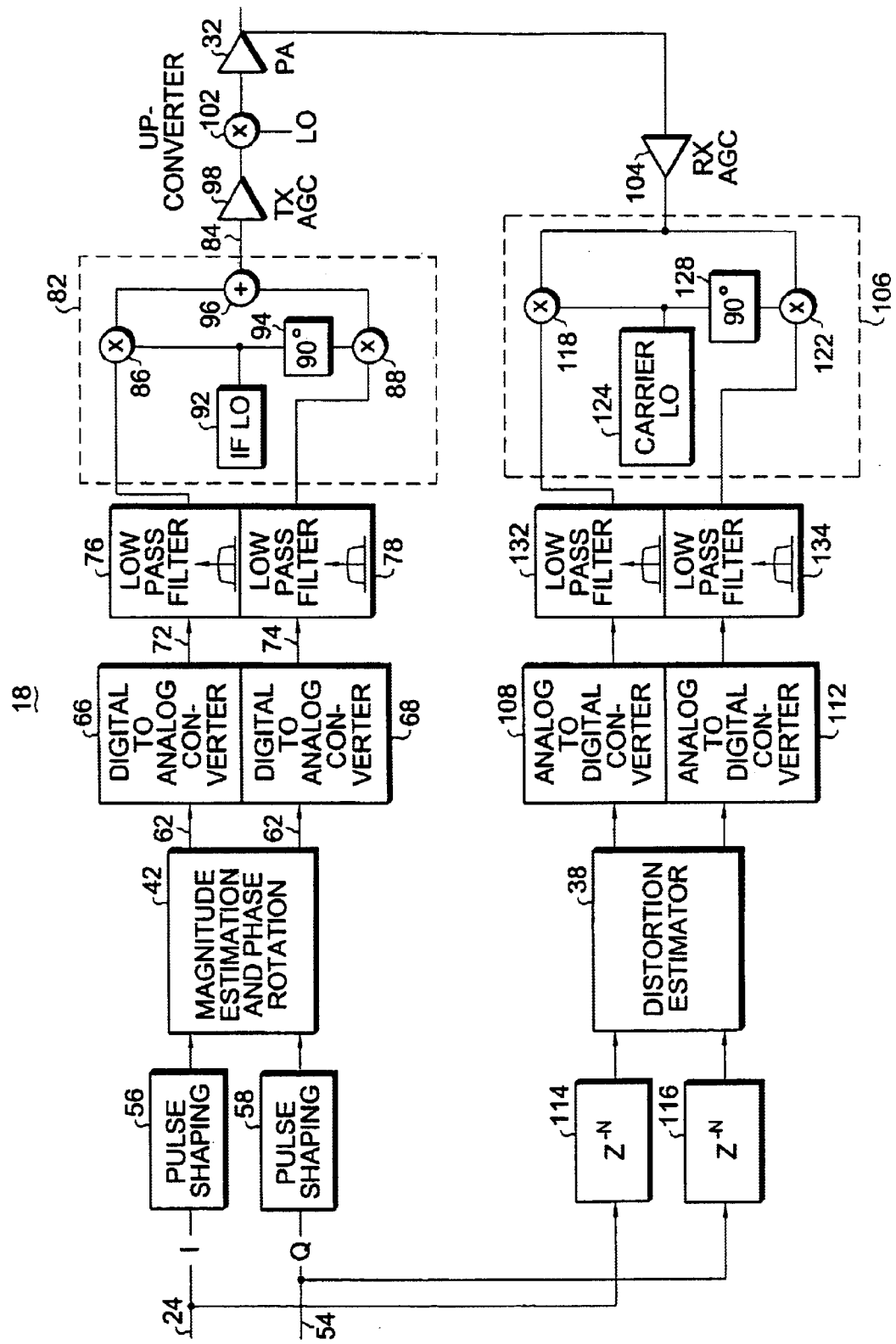
FIG. 2 illustrates a functional block diagram of a portion of a communication station which forms a portion of the communication system shown in FIG. 1.

FIG. 2 again illustrates the transmitter circuitry portion 18 of the first communication station 12. Here, the data sourced at the data source 28 is converted into I-Q component portions generated on the lines 52 and 54, respectively. The component portions generated on the lines 52 and 54 are shaped by pulse-shaping elements 56 and 58, respectively, and thereafter applied to the phase rotator 42.

Phase-rotated symbols generated by the phase rotator 42 are applied, by way of the lines 62 and 64, to digital-to-analog converters 66 and 68, respectively. The converters 66 and 68 convert the symbols provided thereto into analog form on the lines 72 and 74, respectively. The line 72 is coupled to a low pass filter 76, and the line 74 is coupled to a low pass filter 78. Once filtered, signals are applied to a modulator 82 operable to modulate, and to recombine, the I- and Q-components and to generate a recombined signal on the line 84. Here, the modulator is shown to include a pair of mixers 86 coupled to receive the I- and Q-component portions, respectively, and also to receive, at second inputs to the mixers, an intermediate frequency (if) mixing signal generated by an oscillator 92. The if signal applied to the mixer 88 is first, in conventional manner, offset in phase by a 90° phase shift by a phase shifter 94. Mixed signals formed by the respective mixers 86 and 88 are combined at a summer 96 which generates the recombined signal on the line 84.

The signal generated on the line 84 is amplified by a first amplifier 98 and then up-converted in frequency by an up-converter 102. The up-converter is formed of one or more up-conversion stages. Once up-converted to a radio frequency, the signal is applied to the power amplifier 32 to be amplified thereat.

The distortion estimator 38 is again shown to be connected in a feedback arrangement with the power amplifier 32. The feedback path in which the distortion estimator is coupled is further shown to include an amplifier 104, a demodulator 106, and analog-to-digital converters 108 and 112. And, the distortion estimator is also coupled to the lines 52 and 54 by way of delay elements 114 and 116, respectively. Also, the demodulator 106 is shown to include mixers 118 and 122 to which oscillating signals, generated by the local oscillator 124 are also applied. The oscillating signal applied to the mixer 122 is offset in phase by a phase shifter 128. I- and Q-component portion signals generated by the demodulator 108 are provided to low pass filters 132 and 134.

The distortion estimator 38 is thereby provided, by way of the delay elements 114 and 116 baseband signals, I(n) and Q(n) and also the corresponding symbols, subsequent to amplification by the amplifier 32. The additional elements in the feedback path operate in reverse manners to the corresponding elements in the forward path of the circuitry so that the corresponding symbols, $I_{rx}(n)$ and $Q_{rx}(n)$, are provided to the estimator. The estimator forms a distortion measure, e, over M symbols:

$$e = \sqrt{\frac{1}{M}\sum_{n=0}^{M-1}\left(\frac{(I(n-K)+jQ(n-K))}{\max_n |I(n-K)+jQ(n-K)|} - \frac{(I_{rx}(n)+jQ_{rx}(n))}{\max_n |I_{rx}(n)+jQ_{rx}(n)|}\right)^2}$$

The distortion measure, e, corresponds to a normalized, biased-sample, standard deviation of a constellation error. Training is also possible by block processing M symbols, with a value of e being formed at each iteration of M symbols.

The distortion estimator 38 is further operable to determine values of P(t), an input power level of the symbols provided on the lines 52 and 54. The calculated and determine values of e and P(t) are provided to the phase rotator 42. The phase rotator 42 is operable to rotate the symbols applied thereto responsive to calculation of a phase distortion characteristic, θ(P(t)) according to the following equation:

$$\theta(P(t)) = \begin{array}{l} \theta_0, \ 10\log_{10}(1000\,P(t)) < Tdbm \\ \theta_0 + \varphi * 10\log_{10}(1000P(t)) - T), \ 10\log_{10}P(t) \geq Tdm \end{array}$$

Wherein:

ψ is a constant; and

T is an input threshold power in dBm.

Because the parameters T and ψ of the just-described AM-to-PM response must be adjusted with respect to estimations of P(t), a new relationship is derived with respect to the digital magnitude measurement and a scaled threshold, B, as follows:

$$\theta\left(\sqrt{x_I^2(n)+x_Q^2(n)}\right) = \begin{cases} \theta_0, & 10\log_{10}\left(\sqrt{x_I^2(n)+x_Q^2(n)}\right) < B db \\ \theta_0 + \varphi\left(10\log\left(\sqrt{x_I^2(n)+x_Q^2(n)}\right) - B\right), \\ & 10\log_{10}\left(\sqrt{x_I^2(n)+x_Q^2(n)}\right) \geq B dB \end{cases}$$

The modified threshold B is related to B by:

$$B=T+10\ \log_{10}R-30+20\ \log_{10}(t_xd)$$

FIG. 3A illustrates the phase response, shown generally at 144, which graphically represents the AM-to-PM response of the power amplifier 32, and of which the phase distortion characteristic, θ(P(t)), is the distance therefrom. As the graphical representation indicates, the AM-to-PM response is a substantially constant value below a threshold input power level, T. Thereafter, the response is linear, in the log-domain, of which the Y axis is scaled. Thereby, the above AM-to-PM responses, and a phase distortion characteristic defined therefrom, and represented mathematically above, corresponds with the phase response 144 shown in FIG. 3A.

FIG. 3B illustrates the gain response, shown generally at 146, of the power amplifier. Again, here, the gain response is shown to be essentially constant up to an input power threshold level. Thereafter, additional increases in the input power level affect the gain of the amplifier output.

Operation of an embodiment of the present invention, therefore, dynamically determines the amount of distortion introduced upon a symbol of a signal during its amplification by the power amplifier. Responsive to such determination, the symbol is rotated in phase to "predistort" the symbol to compensate the symbol for the subsequent amplification thereof.

Figure 4A:
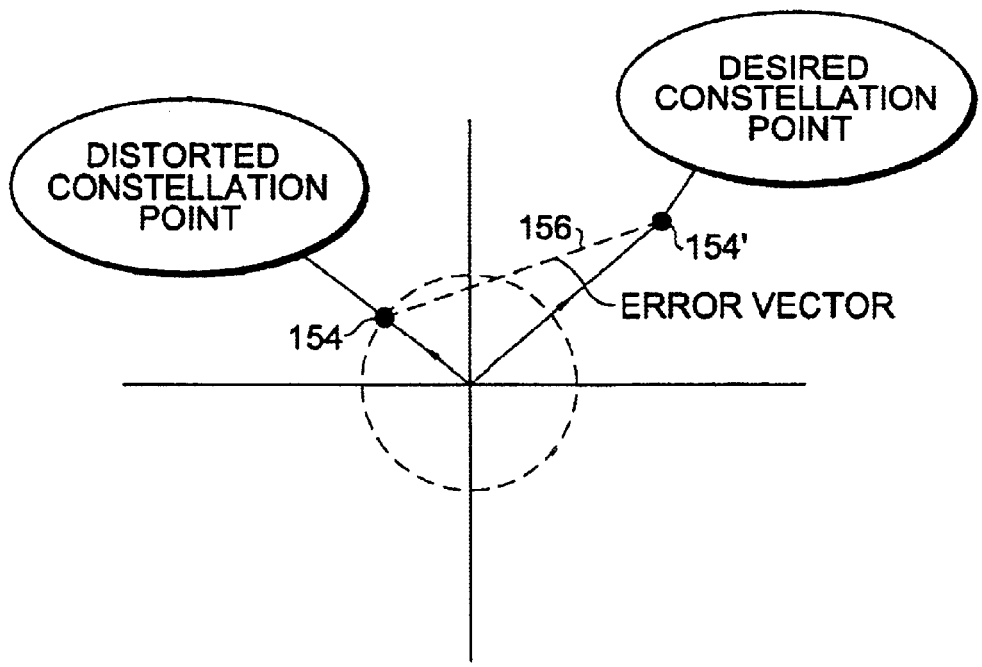
FIGS. 4A and 4B illustrate graphical representations of an exemplary symbol forming a portion of a send signal prior to application to the power amplifier forming a portion of the sending station shown in FIGS. 1 and 2 and the symbol, subsequent to phase rotation thereof effectuated during operation of an embodiment of the present invention.

FIG. 4A illustrates an exemplary QPSK symbol 154, distorted as a result of amplification by a power amplifier. A desired symbol 154' is also shown in the figure. A line segment 156 represents an error vector between the actual symbol 154 and the desired symbol 154'.

Figure 4B:
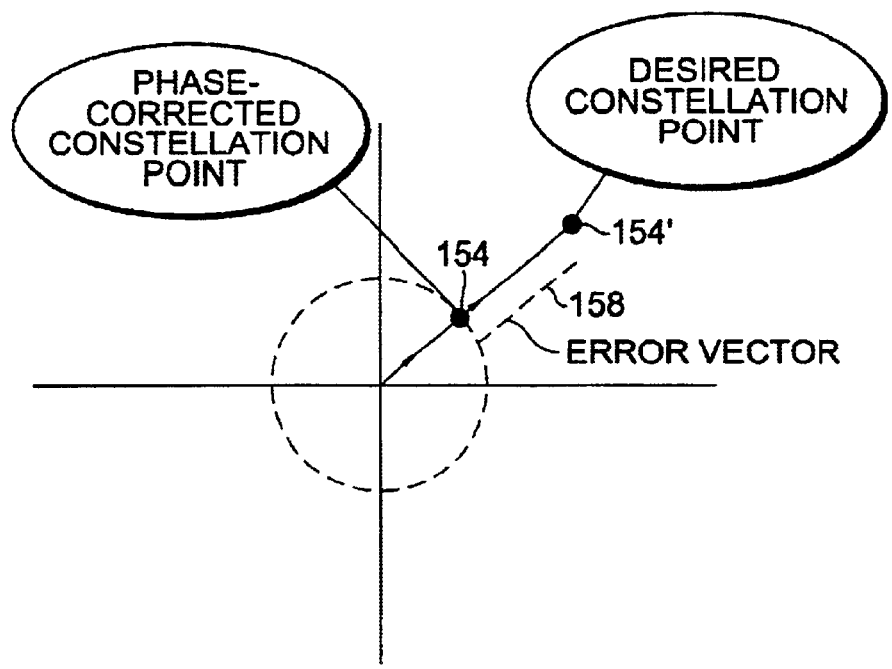

FIG. 4B illustrates the symbol 154 subsequent to correction during operation of an embodiment of the present invention. And, again, the desired symbol 154' is also shown. The symbol is rotated in phase, but the magnitude of the symbol is unchanged. Thereby, the error vector, here designated by the line segment 158, is reduced in length relative to the length of the error vector 154 shown in FIG. 4A. Because the magnitude component of the symbol is unchanged, the system requirements of a CDMA system are maintained.

Figure 5:
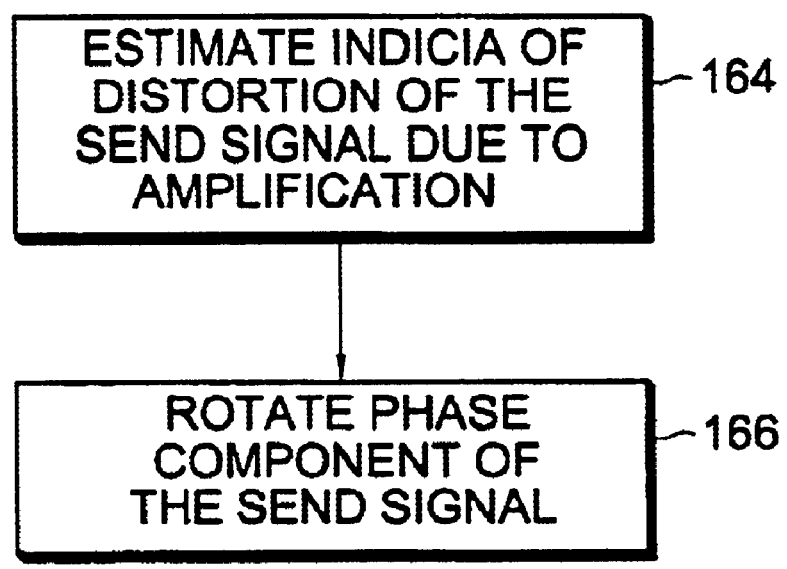
FIG. 5 illustrates a method flow diagram listing a method of operation of an embodiment of the present invention.

FIG. 5 illustrates a method, shown generally at 162, of an embodiment of the present invention. The method compensates for distortion introduced upon a send signal when amplified by an amplifier which forms a portion of a sending station from which the send signal is sent.

First, and as indicated by the block 164, an indicia of distortion of the send signal due to amplification thereof by the amplifier is estimated. Then, and as indicated by the block 166, a phase component of the send signal is selectably rotated responsive to the indicia of distortion estimated during the operation of estimating.

Thereby, through operation of an embodiment of the present invention, symbols to be amplified by a power amplifier are predistorted in a dynamic manner to overcome the distortion introduced upon the symbols when applied to the power amplifier. Compensation is effectuated by rotating a phase component of the symbol without affecting the magnitude component of the symbol.

The previous descriptions are of preferred examples for implementing the invention, and the scope of the invention should not necessarily be limited by this description. The scope of the present invention is defined by the following claims.

I claim:

1. Apparatus for a sending station operable to transmit a send signal, once amplified by an amplifier, the send signal formed of successive symbols, each symbol selected from a constellation of symbols, of said apparatus for compensating for distortion introduced upon the send signal when amplified by the amplifier, said apparatus comprising:

a phase rotator coupled to receive indications of the send signal prior to amplification by the amplifier, said phase rotator for selectably rotating a phase component of the send signal responsive to a characterization of an AM (amplitude modulated)-to-PM (phase modulated) response of the amplifier that defines a phase distortion characteristic of the send signal, the phase distortion characteristic responsive to an input power level of the send signal and of a substantially constant level when the input power level of the send signal is less than a first threshold; and a distortion estimator coupled to receive the indications of the send signal prior to amplification by the amplifier and to receive indications of the send signal subsequent to amplification by the amplifier, said distortion estimator for estimating an indicia of distortion of the send signal due to amplification thereof by the amplifier, the indicia of distortion at least related to a normalized, standard deviation of differences determined between values of the symbols, prior to amplification by the amplifier and subsequent to amplification by the amplifier and for providing a distortion estimate signal to said phase rotator, values of the distortion estimate signal determinative of rotation by said phase rotator of the phase component of the send signal.

2. The apparatus of claim 1 wherein the characterization of the AM-to-PM response of the amplifier comprises at least a first parameter and wherein the distortion estimate signal comprises a value of the at least the first parameter.

3. The apparatus of claim 1 wherein said distortion estimator further determines a value of the input power level of the send signal and wherein the distortion estimate signal comprises an indication of the value of the input power level determined thereat.

4. The apparatus of claim 1 wherein the phase distortion characteristic is proportional to the input power level of the send signal when the input power level is at least as great as the first threshold.

5. The apparatus of claim 1 wherein the sending station is further selectably operable to apply training data to the amplifier, the training data of known values, wherein said phase rotator is coupled to receive indications of the training data, and wherein said distortion estimator estimate an indicia of distortion of the training data due to amplification of the training data by the amplifier.

6. The apparatus of claim 1 wherein the sending station is operable in a communication system which utilizes a QPSK (Quadrature Phase Shift-Keying) scheme, the send signal formed of QPSK symbols defined in the QPSK scheme, said phase rotator for rotating the phase components of the QPSK symbols responsive to values of the distortion estimate signal.

7. The apparatus of claim 6 wherein the sending station forms a portion of a radio transceiver operable in a CDMA (code-division, multiple-access) cellular communication system, wherein each QPSK symbol includes a phase component and a magnitude component, and wherein rotation of the phase component caused by said phase rotator alters the phase component of the QPSK symbol without altering the magnitude component of the QPSK symbol.

8. A method for sending a send signal, once amplified by an amplifier, at a sending station, said method for compensating for distortion introduced upon the send signal when amplified by the amplifier, said method comprising:

characterizing an AM (Amplitude Modulation)-to-PM (Phase Modulation) response of the amplifier, the AM-to-PM response of the amplifier defining a phase distortion characteristic of the send signal, the phase distortion characteristic of a substantially constant level when an input power level of the send signal is less than a first threshold;

estimating an indicia of distortion of the send signal due to amplification thereof by the amplifier and a value of the input power level of the send signal, the indicia of distortion at least related to a normalized standard deviation of differences between values of the send signal prior to and subsequent to amplification by the amplifier; and selectably rotating a phase component of the send signal responsive to the value of the at least the phase distortion characteristic of the send signal.

9. The method of claim 8 wherein the send signal comprises a phase component and a magnitude component and wherein said operation of selectably rotating rotates the phase component of the send signal without altering the magnitude component of the send signal.

10. The method of claim 9 wherein the phase distortion characteristic is proportional to the input power level of the send signal when the input power level is at least as great as the first threshold.

11. Apparatus for a sending station operable to transmit a send signal, once amplified by an amplifier, said apparatus for compensating for distortion introduced upon the send signal when amplified by the amplifier, said apparatus comprising:

a phase rotator coupled to receive indications of the send signal prior to amplification by the amplifier, said phase rotator for selectably rotating a phase component of the send signal responsive to a characterization of an AM (Amplitude Modulation)-to-PM (Phase Modulation) response of the amplifier that defines a phase distortion characteristic of the send signal, the phase distortion characterization of a substantially constant level when the send signal is less than a first threshold; and a distortion estimator coupled to receive the indications of the send signal prior to amplification by the amplifier and to receive indications of the send signal subsequent to amplification by the amplifier, and to receive indications of the send signal subsequent to amplification by the amplifier, said distortion estimator for estimating an indicia of distortion of the send signal due to amplification thereof by the amplifier, the indicia of distortion at least related to a normalized, standard deviation of differences between values of the send signal prior to, and subsequent to, amplification by the amplifier, and for providing a distortion estimate signal to said phase rotator, values of the distortion estimate signal determinative of rotation by said phase rotator of the phase component of the send signal.

* * * * *